United States Patent
De Bosscher et al.

(10) Patent No.: US 8,092,657 B2
(45) Date of Patent: Jan. 10, 2012

(54) MODULE FOR COATING BOTH SIDES OF A SUBSTRATE IN A SINGLE PASS

(75) Inventors: Wilmert De Bosscher, Drongen (BE); Ivan Van De Putte, Roeselare (BE); Koen Staelens, Oudenaarde (BE)

(73) Assignee: Bekaert Advanced Coatings, Deinze (BE)

( * ) Notice: Subject to any disclaimer, the term of this patent is extended or adjusted under 35 U.S.C. 154(b) by 1045 days.

(21) Appl. No.: 11/994,076

(22) PCT Filed: Jun. 14, 2006

(86) PCT No.: PCT/EP2006/063173
§ 371 (c)(1),
(2), (4) Date: Dec. 27, 2007

(87) PCT Pub. No.: WO2007/003488
PCT Pub. Date: Jan. 11, 2007

(65) Prior Publication Data
US 2008/0264785 A1    Oct. 30, 2008

(30) Foreign Application Priority Data
Jun. 30, 2005  (EP) ..................... 05105851

(51) Int. Cl.
*C23C 14/35* (2006.01)
(52) U.S. Cl. ........... 204/192.1; 204/192.12; 204/298.12; 204/298.18; 204/298.21; 204/298.22; 204/298.26

(58) Field of Classification Search ............. 204/298.12, 204/298.18, 298.21, 298.22, 298.26
See application file for complete search history.

(56) References Cited

U.S. PATENT DOCUMENTS

| | | | |
|---|---|---|---|
| 4,417,968 A * | 11/1983 | McKelvey | 204/192.12 |
| 4,790,921 A | 12/1988 | Bloomquist et al. | |
| 4,915,805 A | 4/1990 | Rust | |
| 5,338,422 A * | 8/1994 | Belkind et al. | 204/192.12 |
| 5,382,126 A * | 1/1995 | Hartig et al. | 414/217 |
| 5,529,674 A | 6/1996 | Hedgcoth | |
| 5,645,699 A | 7/1997 | Sieck | |
| 6,488,824 B1 | 12/2002 | Hollars et al. | |
| 2003/0150712 A1 | 8/2003 | Reiter et al. | |

FOREIGN PATENT DOCUMENTS
EP         1 179 516 B1    2/2002
WO        WO 99/26274 A1  5/1999
* cited by examiner

*Primary Examiner* — Rodney McDonald
(74) *Attorney, Agent, or Firm* — Foley & Lardner LLP

(57) ABSTRACT

A module to carry targets in a sputter deposition installation for coating two-sided substrates is described. The module is mountable to the installation through an interface flange that carries at least two targets with their associated magnet systems. When the module is mounted, the targets take positions at opposite sides of the two-sided substrate, while the magnet systems orient the sputter deposition towards the substrate. The module enables coating of both sides of the substrate in one single pass. Different configurations are described with gas distribution systems and additional substrate supports. An enclosure with adjustable blinds in order to reduce gas spreading is also included.

12 Claims, 7 Drawing Sheets

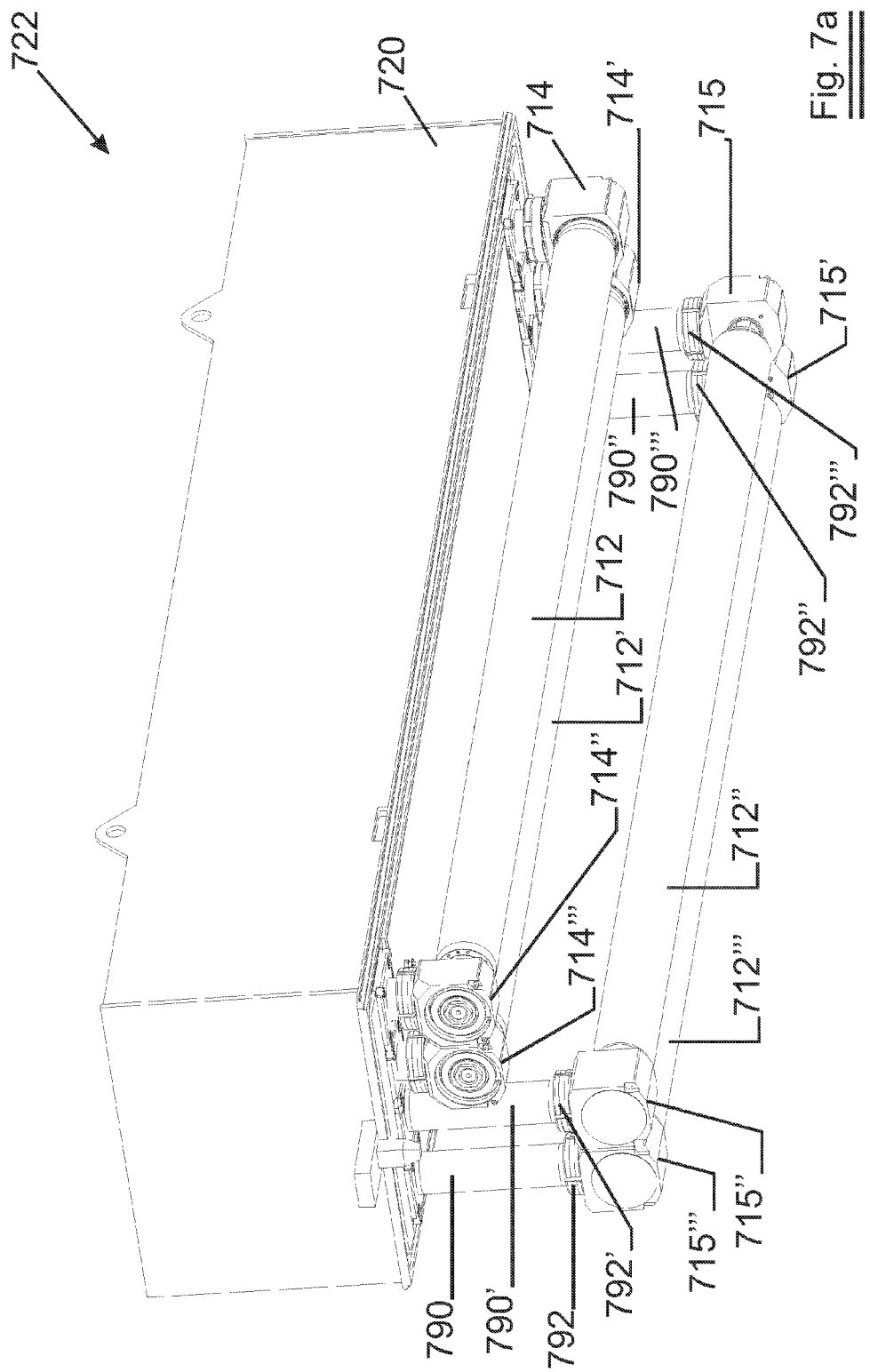

MODULE FOR COATING BOTH SIDES OF A SUBSTRATE IN A SINGLE PASS

FIELD OF THE INVENTION

The invention concerns a module mountable on a vacuum sputter coater. The module carries, energises and cools at least two targets that coat either side of the substrate in a single pass.

BACKGROUND OF THE INVENTION

Sputter deposition has become a widespread technique to add functionalities to substantially planar substrates such as film or sheet form materials. In a low-pressure sputter deposition coater, ionised noble gas ions are accelerated towards a negatively biased target. Atoms are kicked out of the target when the noble gas ions impinge on its surface. A magnet system may be provided under the target surface to confine the free electrons in a racetrack. Within the racetrack the ionisation degree of the noble gas is greatly increased and the ion bombardment of the target is therefore more intense below the racetrack. Hence the magnet system defines the area on the target from which atoms are sputtered away. Moreover, under the racetrack, target atoms are ejected mainly in a direction perpendicular to the surface of the target. Such a process is known as magnetron sputter deposition. The knocked-out atoms hit the substrate surface where a dense coating forms. When also reactive gasses are admitted into the coater, reactions with the impinging target atoms will occur at the surface of the substrate, enabling the formation of compound materials such e.g. as oxides or nitrides. In the case of reactive magnetron sputter deposition it has been found to be very advantageous to introduce two targets in the coater that are alternately used as a cathode and an anode. This is known in the art as alternating current (AC) magnetron sputtering—when a sinusoidal current or voltage source is used—or pulsed magnetron sputtering—when a switched direct current (DC) voltage or current source is used.

The functionalities added to the substrate can be diverse. Film-like materials can e.g. be provided with a moisture barrier for packaging applications or can be made electrically conductive with a transparent ITO (Indium tin oxide) coating for use in e.g. touch-screens. Sheet-like materials such as e.g. windowpanes or display glass sheets—for use in a flat panel display—can be coated with an anti-reflective coating or a low-emissivity coating. Magnetic coatings or protective coatings—such as diamond like coatings (DLC)—are applied on disks to provide for the necessary magnetic and protective properties of a hard disk.

Nowadays there is an emerging need to apply a coating on both sides of such planar substrates. The coating on either side can be different or can be equal in nature depending on the use. Some areas where the need for such double-sided coating application is particularly felt are:

- Display coaters where an anti-reflective coating is applied on the viewing side of the coater and a transparent conductive oxide can be coated on the other side.
- Magnetic hard disks where equal coatings are applied on both sides as both sides are used for magnetically storing and reading data.
- Windowpanes where a low-emissivity layered stack is applied on the interiorly oriented side of the glass pane, while a soil-resistant coating is applied on the weather exposed side of the window. Such windows have the particular advantage that they are "self-cleaning" or "easy-cleaning".

The diversity in functionalities added by the sputter coating process is reflected in the plethora of sputtering installation types that are available nowadays. Film-form materials are mostly coated in roll-to-roll web coaters wherein the film is unrolled from a single roll, passes on a central cooled drum around which different sputtering stations are arranged circumferentially before being wound onto a roll again. Some roll-to-roll coaters have a free span section i.e. a section where the film is held taut between two parallel rolls while being coated. Glass for flat panel displays is predominantly coated in vertical display coaters wherein the glass pane is passed in front of one or more sputtering stations by means of a conveyor system that transports the glass pane under a slant angle. Windowpanes are almost exclusively coated in large area glass coaters wherein the horizontally oriented glass sheets pass on rollers underneath different sputtering stations.

For certain areas, solutions have been proposed to provide a coating to both sides of the substrate in one single pass.

In the field of hard disks, US 2003/0150712 suggests the use of two oppositely oriented separate banks of planar or rotary targets to coat both sides of the disks arranged in a planar substrate holder that passes in between these banks.

In the field of windowpane coating, EP 1179516 B1 describes the idea of a two-sides coating process in which not only the substrate is coated from top to bottom, but also from bottom to top at the same time but in different sections of the coating line, thus eliminating the need of a second passage or the need for a flip-over installation. In this publication it is described that sputtering targets can also be mounted on the bottom of the coating installation as e.g. depicted in FIG. 1.

However, the proposed solutions are not always satisfactory. All infrastructures to cool, to energise and to carry the target and the gas feed system must be made in double leading to an 'installation problem'. In particular for large area windowpane coaters the investment needed to refurbish the installation so as to accept lower target mounting is high. As the total number of layers that have to be deposited is increased and the layers cannot always be deposited at both sides in the same line section, the coating line may have to be lengthened (a costly investment), or the line speed may have to be decreased (reducing the throughput). In addition, the coating target at the lower side of the coating installation is not easily accessible for replacement and servicing.

A second problem associated with the described art is that although the planar substrates provide some division between the upper and lower part of the sputtering chamber, this separation is not gastight and process gasses are mixed between the upper and the lower part of the chamber (the 'gas mixing problem'). The layers to be deposited on both sides can therefore not be chosen at will. For example it is not possible to deposit on the top side an oxide such as $SiO_2$ using a silicon containing target and oxygen as a reactive gas, and at the bottom side a $Si_3N_4$ coating deposited from a silicon target in a nitrogen atmosphere: the more reactive $O_2$ gas at the top side will disturb the reaction of the less reactive $N_2$ gas at the bottom side. Not only gasses are intermixed, but apparently also the target materials may overspray the margins of the glass pane as explained in EP 1179516 B1.

The inventors therefore set themselves the task to overcome the mentioned problems and to come up with a solution that will now be described in more detail.

SUMMARY OF THE INVENTION

The object of the invention is to resolve the prior-art problems. A first object is thus to resolve the cost problem in providing a module that does not necessitate a refurbishment of a part or even the complete installation. In addition the invention prevents the need for introducing additional sections or to slow down the line speed by providing additional coating capacity within the existing line length. Moreover the costly doubling of target ancillaries is prevented. A second object of the invention is to solve the gas-mixing problem, thus allowing a more flexible use of a single line section. In the same effort, the problem of overspray over the edges of the substrate is solved.

The inventive device is to be used for coating a substrate that is long (tenths of meters in case of a flat panel display sheet, meters in case of a sheet, kilometers in case of film-like material), relatively wide (somewhat smaller than the width of the installation that is normally in the meters scale), and very thin (tens of micrometers in case of a film, tenths of a mm for a flat panel display sheet up to a few mm in case of a windowpane). So such a substrate can be described as having mainly two sides and limited side edges. In case a carrier holding a multitude of planar items to be coated is used, the carrier with the items is considered to be the substrate as long as it is thin compared to its length and width dimension. The direction of movement of the substrate is along its length or width dimension.

Basically there are two types of targets that can be used in the inventive concept: planar targets or rotatable targets. A combination of both is not excluded. Both of the types have their advantages and disadvantages that are known to the person skilled in the art and which will not be discussed here. Planar targets comprise a flat and elongated piece of target material mounted to a carrier, and a magnet system positioned at the side of the material that is opposite to the side that is to be sputtered. Feed-through means to cool and energise the target are also needed. For the purpose of this application, this feed-through means will be called a connector block. There are also planar target assemblies available in which the magnet array is moveable relative to the target material to obtain a more uniform erosion of the target (see WO 99/26274).

In a rotatable target the target material is deposited on a carrier tube. A relative motion between target material and magnet array is obtained by keeping the magnet array fixed inside the carrier tube while the carrier tube with the target material rotates in front of it. The target is carried by one connector block at one end or by two connector blocks at either end of the carrier tube.

There are two ways in which the sputter target or targets are brought into position relative to the substrate to be coated. Both ways apply equally well to planar or rotatable targets. For large area coaters a drop-in module is used: this module comes in the form of a top box that is bolted to the evacuable chamber by means of an interface flange with a vacuum sealing gasket. In the box all necessary feeds (coolant, electrical current, movement, process gas supply) are provided as well as the necessary control electronics. The target is fed with electrical current and coolant through one or two or more connector blocks that connect to the interface flange at one side and to the target at the other side. A gas distribution tree in the vicinity of the target distributes the gas. Normally two targets are mounted side by side to allow alternating or pulsed current sputtering.

In a web coater the targets are positioned in a cantilevered way i.e. the target is held by a single, straight-through connector block that is mounted on an interface flange or wall of the apparatus that is perpendicular to the axis of the target. For wide coaters, a purely mechanical bearing holds the other end in which case one could speak of a semi-cantilevered target mount. Note that the cantilever mount is not exclusive to web-coaters: also large area coaters can be equipped with a set of cantilevered targets. Again two sputtering targets are mounted side by side in case one uses alternating or pulsed current sputtering.

From the above it will be clear that more functionalities are needed in the connector block for rotatable targets compared to connector blocks for planar targets. In addition to the electrical current and coolant feed-through that are needed in case of a planar target, the rotatable target has to be rotated, the magnet array has to be kept stationary and the vacuum integrity has to be maintained by the connector block.

The inventive module that carries sputtering targets comprises an interface flange that can be mounted vacuum tight on a sputtering installation. This interface flange serves as the mounting platform to which the targets are attached at the vacuum side, while ancillary equipment is built on the atmospheric side. As discussed above, such a sputtering installation can be a display coater, a large area coater, a web-coater or any coater that is intended for coating substrates having two sides like the aforementioned sheet-like or film-like materials. The invention can be now characterised by the feature that when the module is mounted with said interface flange to the installation, at least one of the targets takes a position at one side of the substrate, while another target takes a position at the other side of the target. The magnet systems of each of the targets are faced towards the substrate so as to enable coating of both sides of the substrate in one single pass.

Both targets can thus be mounted in place by mounting a single interface flange. Moreover the flange of the module can be made compatible with the existing flanges for single side sputtering. Hence the 'installation problem' is greatly solved by providing such a module. Note also that the throughput through the installation is not affected although both sides may be differently coated. The throughput of an existing installation can effectively be doubled for single side coatings. Indeed: by driving two sheets carefully stacked on top of each other through the installation the net output is the double as two sheets are coated one-sidedly in one go.

According to another example, the targets are planar targets. In another example the targets are rotatable targets. The combination of at least one planar target with at least one rotatable target is of course also possible.

A first mounting possibility is that the axes of the targets are substantially perpendicular to the interface flange. With the axis of a planar target is meant the symmetry line according to its longest dimension. With the axis of a rotatable target is meant the rotation axis of the target. To connect a target to the interface flange, at least one connector block is mounted to the flange wherewith a removable connection to the target can be made. The mounting of the connector block to the flange can be made permanent such as e.g. by making the flange and connector block container out of a single piece of metal like stainless steel or machine steel. Or the connector block container can be assembled to the mounting flange by bolting. Quick-fit connections of the connector block container to the flange are also possible. In case the target is planar, such a connector block is relatively easy since no moving parts have to be interfaced to one another. In the case of a rotatable target a more complex connector block is needed such as e.g. described in U.S. Pat. No. 5,200,049. In the latter case it may be necessary to support the free end with a purely mechanical bearing to prevent sagging of a horizontal rotatable target or to prevent out-of-centre rotation in case of a vertical rotatable target. Such a bearing is not considered to be a connector block.

An alternative, second mounting possibility is when the axes of the targets are substantially parallel to the interface flange. These targets are then carried by the interface flange through two connector blocks positioned at the ends of the targets. These two connector blocks will carry at last two targets. Or they can carry three targets: for example one rotatable target farthest away from the interface flange and two planar targets closer to the interface flange. Most preferred is that four target ends connect to one connector block. This can make the design cheaper as more parts of the connector block can be shared e.g. there is only one single housing needed, one motor can drive all targets. Connecting more than four target ends to one connector block may be difficult (but not impossible) to implement.

An alternative way to carry the targets is to provide one connector block for each target end. Since at least two targets are needed to implement the invention, this implies that then at least four connector blocks must be present: two at each end of the module. Likewise, in the case of three targets, six connector blocks and in the case of four targets eight connector blocks have to be provided. In general the maximum number of connector blocks will be twice the number of targets carried by a single module. Although these connector blocks will take up more space at the ends of the interface flange, the advantage of this design is that connector blocks can be standardised.

The above-described module may also be equipped with at least one gas distribution system. Better is of course if the module carries two separately controllable gas distribution systems at either side of the substrate to be coated. The feeds to the gas distribution systems may conveniently be incorporated in the connector blocks. In order to ease the crossing of the sheet over the roll conveyor between the targets, one or more intermediate supports can be provided to support the sheet in the middle of the module. Again these supports can be conveniently held by the connector blocks.

A further improvement to the module is the provision of an enclosure enclosing the connector blocks, the targets and the other ancillaries as the supports and the gas distribution. Of course an entrance and exit elongated slit has to be provided to let the substrate pass through. The enclosure will thus not be gas-tight but it will provide a barrier against gas spreading throughout the installation. In addition such an enclosure has the advantage that it will collect spilled sputtered material that then no longer will reach the walls of the evacuable chamber, eliminating the need to clean the chamber. By making the enclosure in a low cost, disposable material or by putting a disposable sheet at the inside of the enclosure one can further reduce this hazardous and tedious work. Introducing side blinds that come close to the edges of the sheet- or film-like material can further prevent gas spreading. By preference such side blinds are adjustable to the width of the sheet or film that may vary from run to run. In this way two different gas atmospheres can exist at either side of the substrate. When the sides of the blinds are equipped with V-shape edges, the straight travelling target atoms from one target can be stopped by the blinds before reaching the other target, hence preventing target contamination.

In the case of sheet like material, the sheets may not always lie well and be well aligned on the roller conveyor. By introducing a width detector in front of the slit and adjusting the position of the blinds according the input of the detector, the separation of gasses may be further improved. Such a detector system may be conveniently implemented by a mechanical system of wheels and springs that push open the blinds on entry. Another possibility is to have such a system implemented by means of an electronic (optical, magnetic or mechanical) detector and feedback system.

BRIEF DESCRIPTION OF THE DRAWINGS

The invention will now be described into more detail with reference to the accompanying drawings wherein.

DESCRIPTION OF THE PREFERRED EMBODIMENTS OF THE INVENTION

Figure 1:
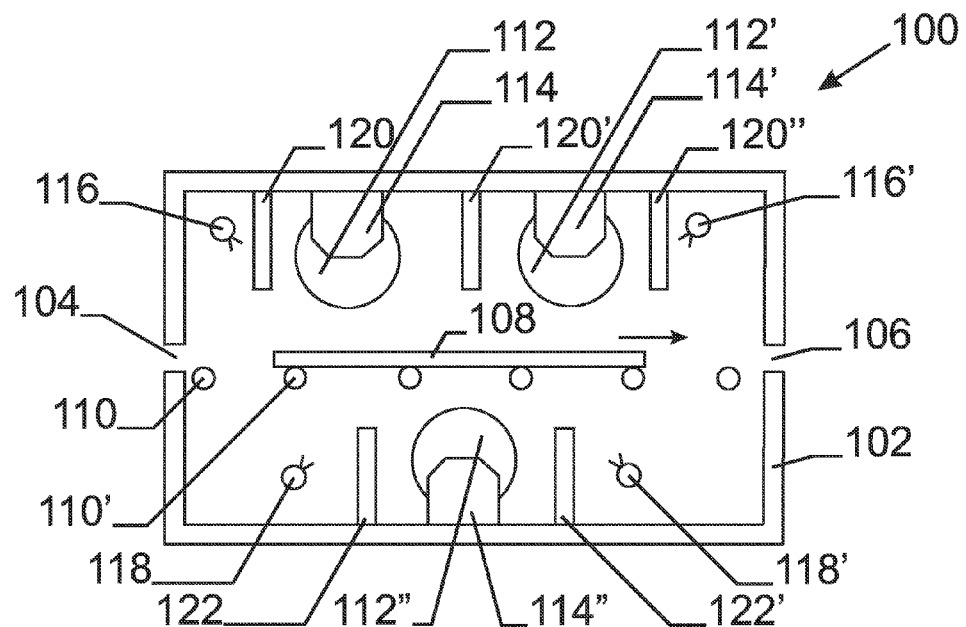
FIG. 1: the state-of-the-art as described in EP 1 179 516 B1.

FIG. 1 shows how a sheet-like substrate can be coated on both sides in a single pass as described in EP 1 179 516 B1. It schematically shows a single section 100 out of a glass coater. The section 100 is in essence an evacuable chamber 102 that connects to the previous section with an entrance gate 104 and to the next section with an exit gate 106. The substrate 108, in this case a sheet-like material, is conveyed on a series of rollers 110, 110', ... of which some or all are driven. In this particular embodiment, three rotatable targets 112, 112' and 112" are depicted that are held by means of a pair of connector blocks 114, 114' and 114" (only one connector block is drawn as it covers the other connector block at the opposite side). Gas distribution pipes 116, 116' for the upper targets as well as pipes for the lower target 118, 118' are provided. These pipes distribute either the sputtering gas or the reactive gas or a mixture of both throughout the chamber. Anode screens 120, 120', 120" are provided sideways from the upper targets as well as sideways from the lower target 122, 122'. These can be electrically polarised in order to affect the racetrack that forms on the target surface (as described in U.S. Pat. No. 5,645,699).

Figure 2:
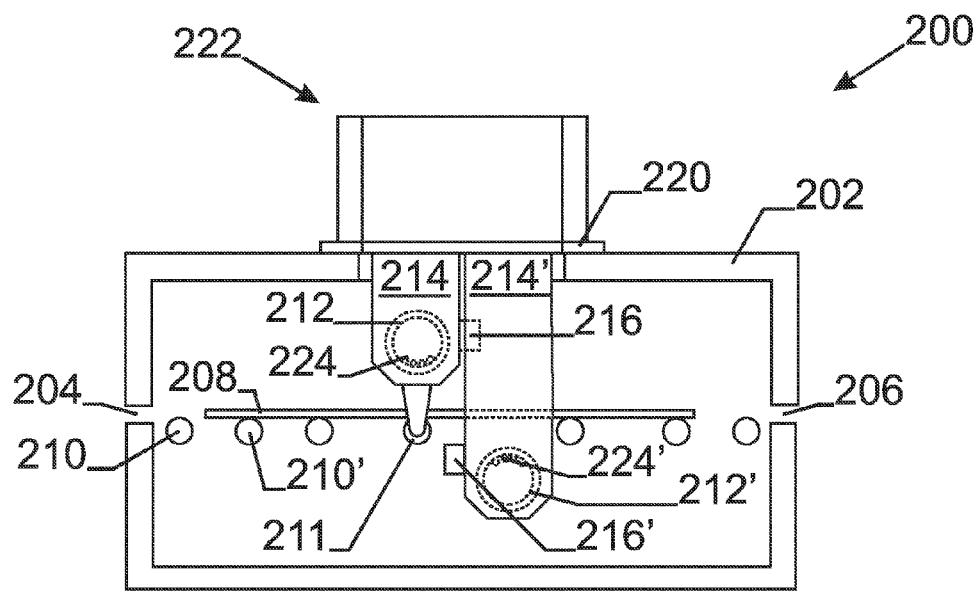
FIG. 2: the inventive module according a first preferred embodiment with two targets

FIG. 2 shows a particularly favoured implementation of the inventive module as it can be readily implemented in existing installations. Again a single section 200 of a complete coating line is shown. Again a vacuum enclosure 202 isolates the sputtering process from the environment. A sheet like material 208 enters the sputtering section 200 through an entrance gate 204. The sheet 208 is carried by a roller conveyor, comprising several rollers 210, 210', ... of which some or all are driven. The sheet 208 exits the section 200 through exit gate 206. On the section 200 a module 222 is mounted that connects to the chamber wall 202 through an interface flange 220. On this interface flange 220, two pairs of connector blocks 214 and 214' are mounted that on their turn carry the targets 212 and 212'. Again only one connector block is visible, the other is situated behind the shown connector block. The connector blocks 214, 214' energise, cool and rotate the targets 212, 212' while keeping them parallel to the substrate 208. Inside each target 212, 212' a magnet array 224, 224' is held stationary by the end blocks 214, 214'. The magnet arrays are oriented such that the first array 224 directs the target atom flux towards the first side of the substrate 208 and that the second array 224' directs the target atom flux towards the second side of the substrate 208. Each side of the target has its own gas distribution system 216 and 216' that are attached to the connector blocks. A support 211 implemented as a non-driven roller is held by a pair of attachments that are fixed to the pair of connector blocks 214. The roller 211 provides additional support as the substrate 208 passes through the installation.

Figure 3A:
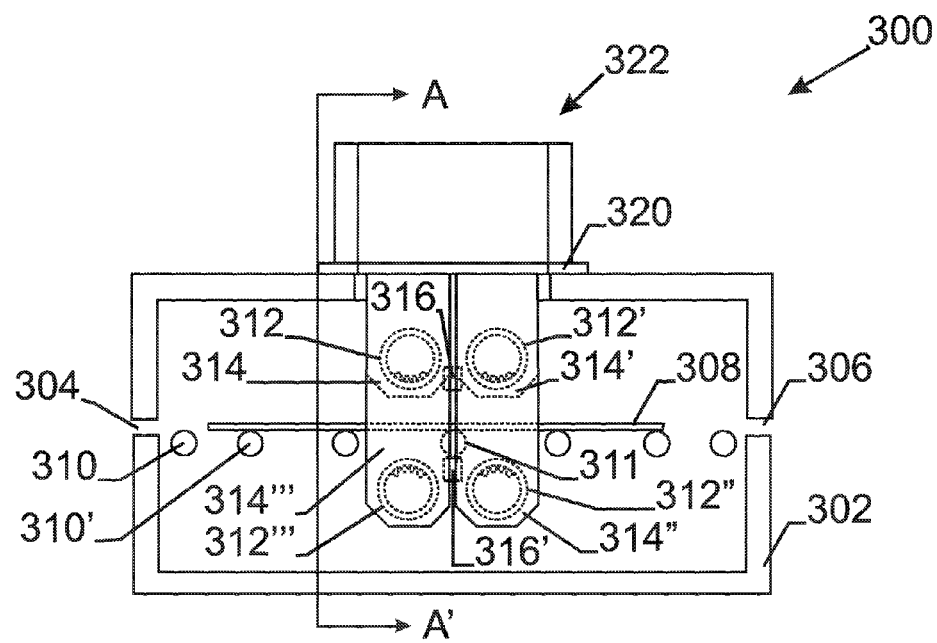
FIG. 3: 'a' is a side view and 'b' a front view of a second preferred embodiment with four targets.
Figure 3B:
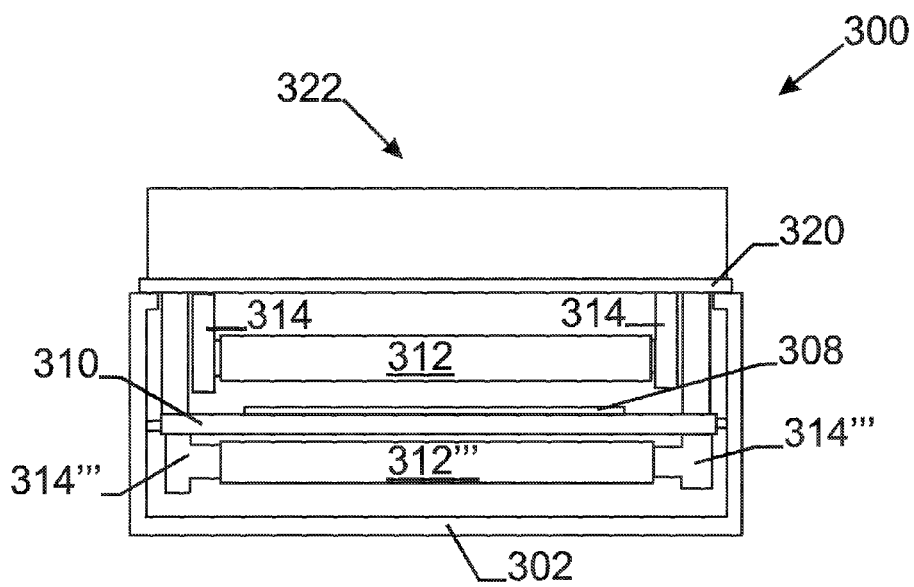

FIG. 3 shows a second preferred embodiment with four targets and eight connector blocks. FIG. 3 'a' shows a sideways view while FIG. 3 'b' shows a front view as seen from the line AA'. Like numbers refer to like parts in drawings 'a' and 'b'. Again one single 300 section of the complete coating line is picked out. Through a chamber 302 with an entrance 304 and an exit gate 306 a sheet-like substrate 308 is carried by a series of rollers 310, 310', . . . . The module 322—that interfaces with the chamber 302 through interface flange 320—carries now four pairs of connector blocks 314, 314', 314", 314'" (of which each time only one of the pair is visible) that on their turn carry four targets 312, 312', 312", 312'". The position of the connector blocks is better understood by looking at FIG. 3 'b': the pair of connector blocks 314 of the upper target 312 is mounted in between the pair of connector blocks 314'" of the corresponding lower target 312". The same applies for the pair 314'—carrying the target 312'—that is mounted in between the pair 314" that carries the target 312". In between the upper two pairs of targets 312, 312' a gas distribution system 316 is mounted for feeding gasses towards the first side of the substrate. A second gas distribution system 316' feeds gasses towards the second surface of the substrate. An intermediate roller 311 is mounted in between the two pairs of connector blocks to prevent sagging of the substrate.

Figure 4A:
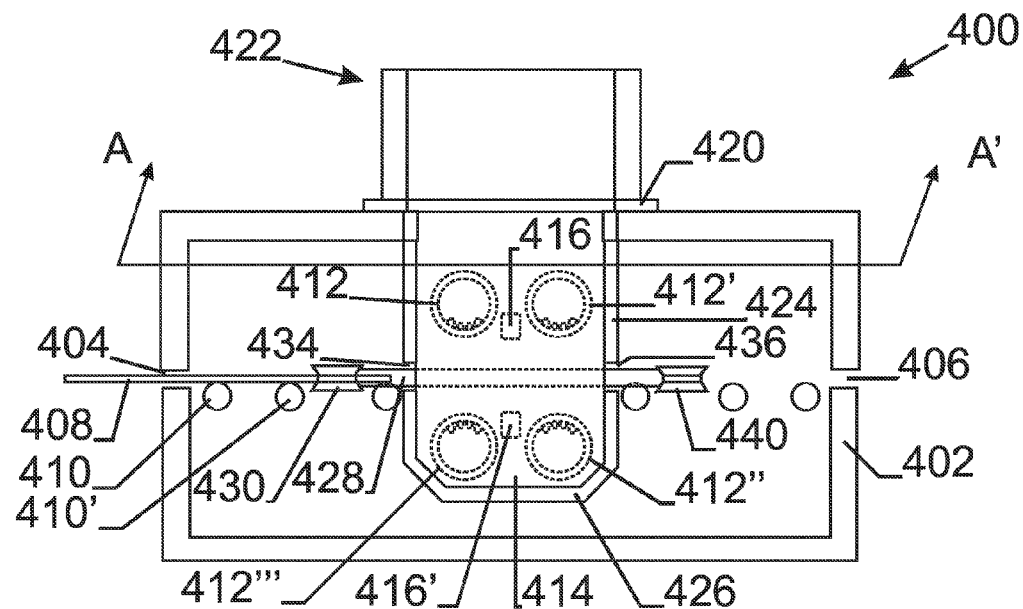
FIG. 4: 'a', 'b' and 'c' illustrate a third preferred embodiment with four targets with a gas enclosure.
Figure 4C:
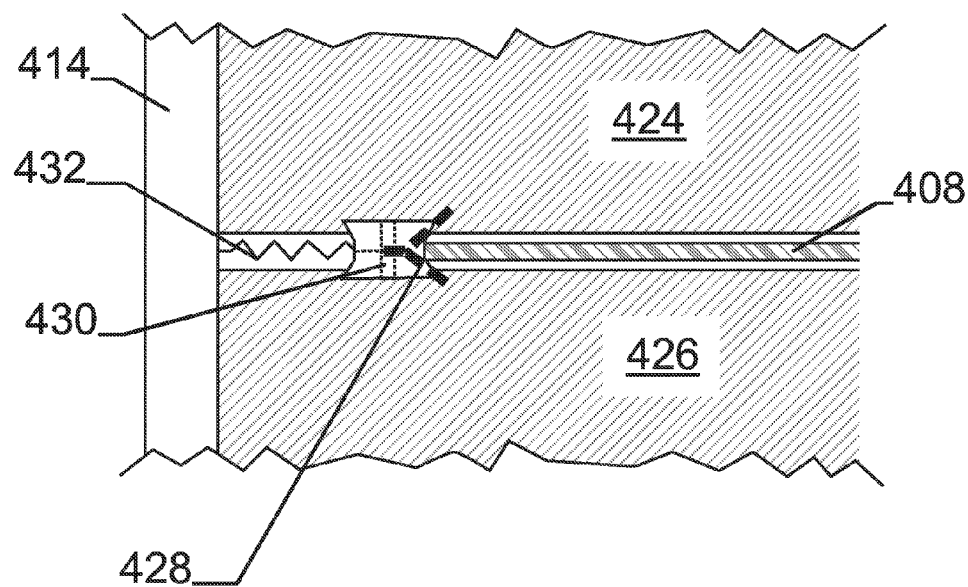
Figure 4B:
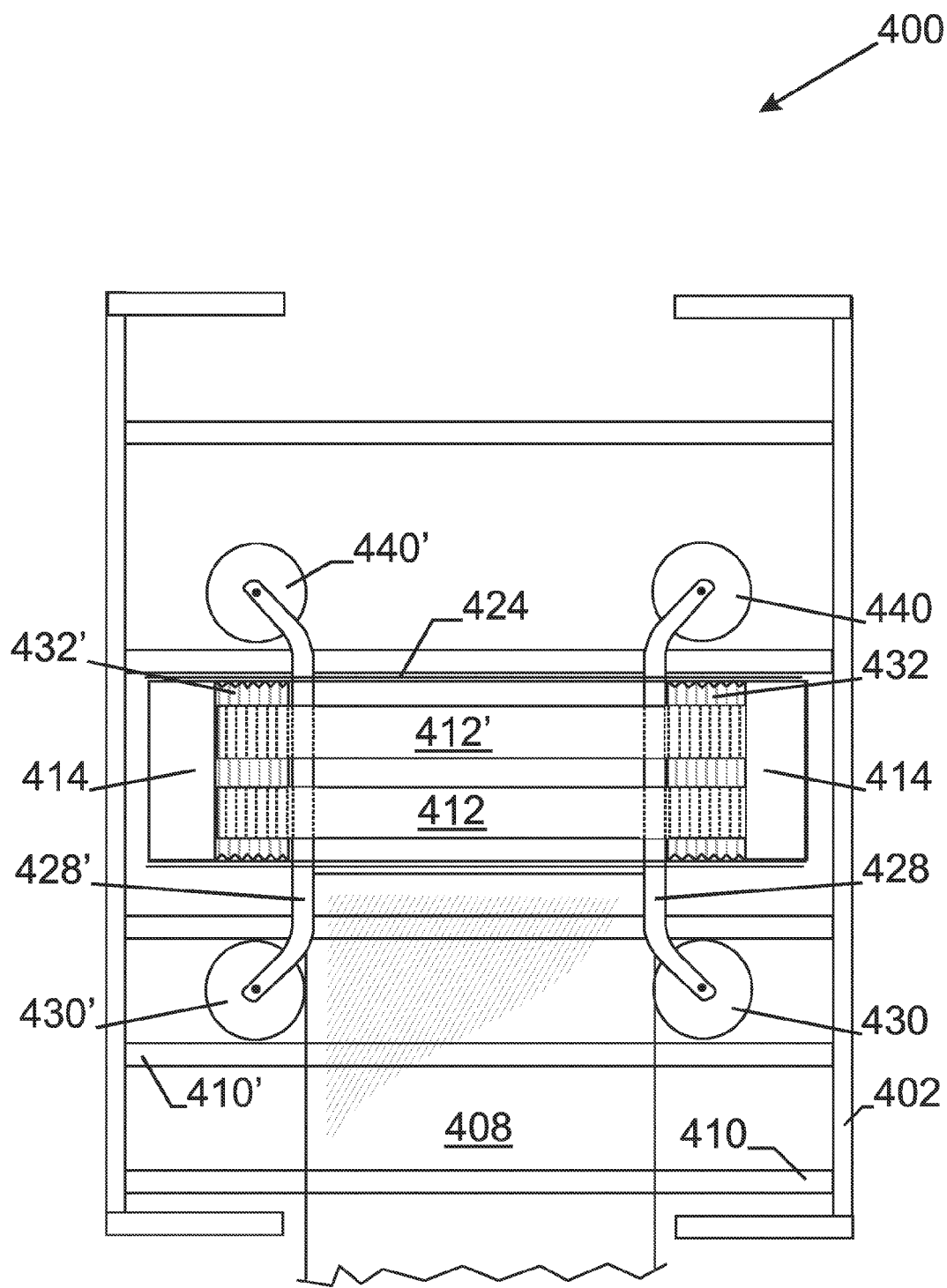

FIG. 4 shows a third preferred embodiment of which the 'a' part is a side view along the axis of the targets, 'b' is a top view along the cut AA' and 'c' shows a detail of the adjustable blends. The module 422 is mounted with an interface flange 420 to the chamber 402 of a section 400 of a coating installation. The interface module carries one pair of connector blocks 414 that carries now four targets 412, 412', 412" and 412'". Each of the connector blocks thus integrates four end connections to the targets, which allows for a reduction of internal parts as some of them can be shared. Between the pair of connector blocks 414 two gas distribution systems 416 and 416' are mounted at either side of the substrate 408. Around the targets, an enclosure 424, 426 is fixed to the connector block pair 414 that has an upper part 424 and a lower part 426 while in between an entrance slit 434 and exit slit 436 is left open where the substrate 408 can pass through. While such an enclosure 424, 426 on itself helps to retain the process gasses in the vicinity of the targets, gasses can still mix inside the enclosure. Therefore side blends 432 and 432' (FIG. 4*b*) can glide in the entrance and exit slit 434, 436. One side of each blend is fixed to a connector block of the pair 414. The other end is adjusted as close as possible to the substrate 408. There are a number of ways in which such a side blend can be implemented: they can be made of metal strips that slide over one another or they can be made of thick metal foil that is zigzag folded to name just a few ways. To obtain self-adjusting blends, the zigzag folded blends 432, 432' are preferred because they introduce some resiliency. To obtain self-adjustment, a glider 428, 428' is attached to the free moveable end of the blend 432, 432'. Outside the enclosure 424,426 a wheel 430, 430' with its axis vertical to the substrate is attached to the curved end of the glider 428, 428'. When now a substrate 408 nears the module, the wheels 430, 430' will slide apart freeing the way for the substrate. By giving the glider 428, 428' a V-shaped profile at the inside of the enclosure (as shown in FIG. 4 'c') target contamination may be totally prevented as the targets are not longer in each others line of sight. Gas mixing can be reduced because the blends greatly reduce the gas interaction between the upper and lower part of the enclosure. The use of wheels can be prevented by using half-cone entries at the ends of the gliders: the substrate is caught in these half cones and the gliders open, giving way to the substrate. It is preferred that the interior of the half cones and the part of the gliders that come into contact with the substrate edges are coated with an anti-friction coating. In this way an even better gas separation can be obtained.

Figure 5:
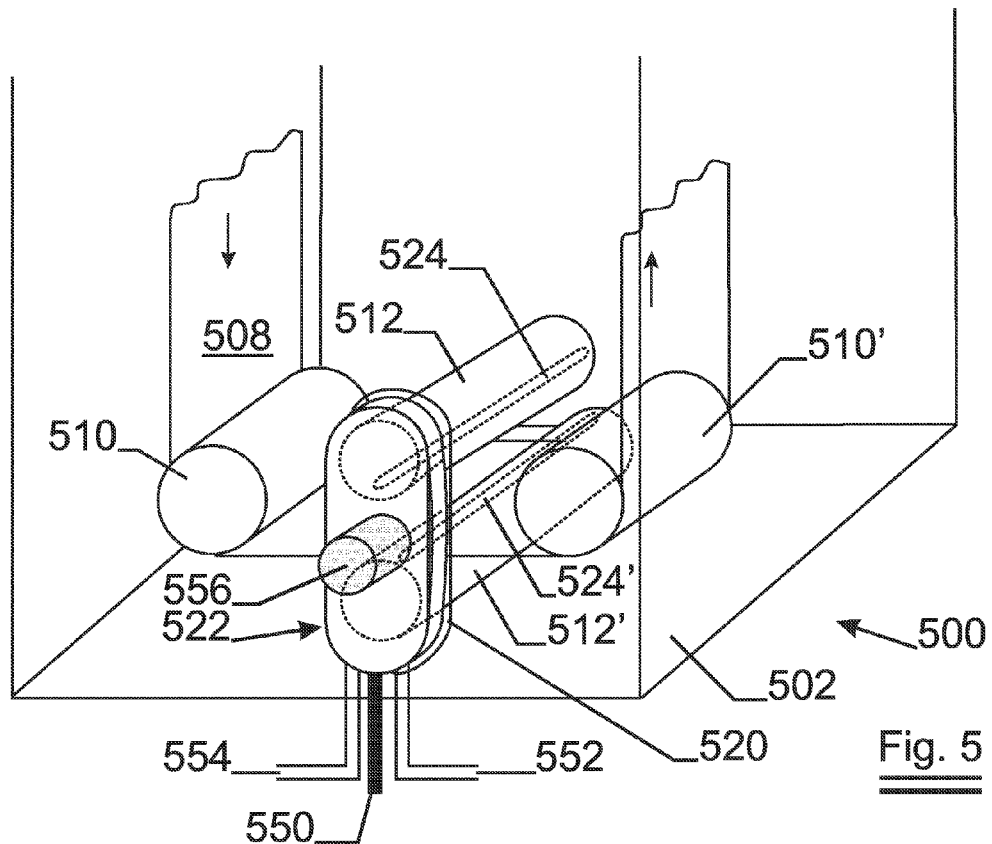
FIG. 5: depicts a fourth preferred embodiment of the module that is suitable for use on a free span web coater.

FIG. 5 shows a perspective view of a third preferred embodiment that is the implementation of the inventive idea on a free span web coater. A part of the coater 500 is shown in which the coating takes place. Other ancillaries such as unwinding and take-up system are not shown but are known to the person skilled in the art. In this case the substrate is a film 508 that is held taut between two rollers 510, 510'. In the free span the film 508 passes in between two rotatable targets 512, 512' whereof the magnet system 524, 524' directs the sputter deposition to either side of the film 508. A single module 522 that connects to the chamber 502 through an interface flange 520 carries the rotatable targets 512, 512'. The rotatable targets 512, 512' are driven by a single motor 556. The coolant is supplied through coolant supply 552 and extracted through outlet 554. Current feed 550 provides current to the targets 512, 512'.

Figure 6:
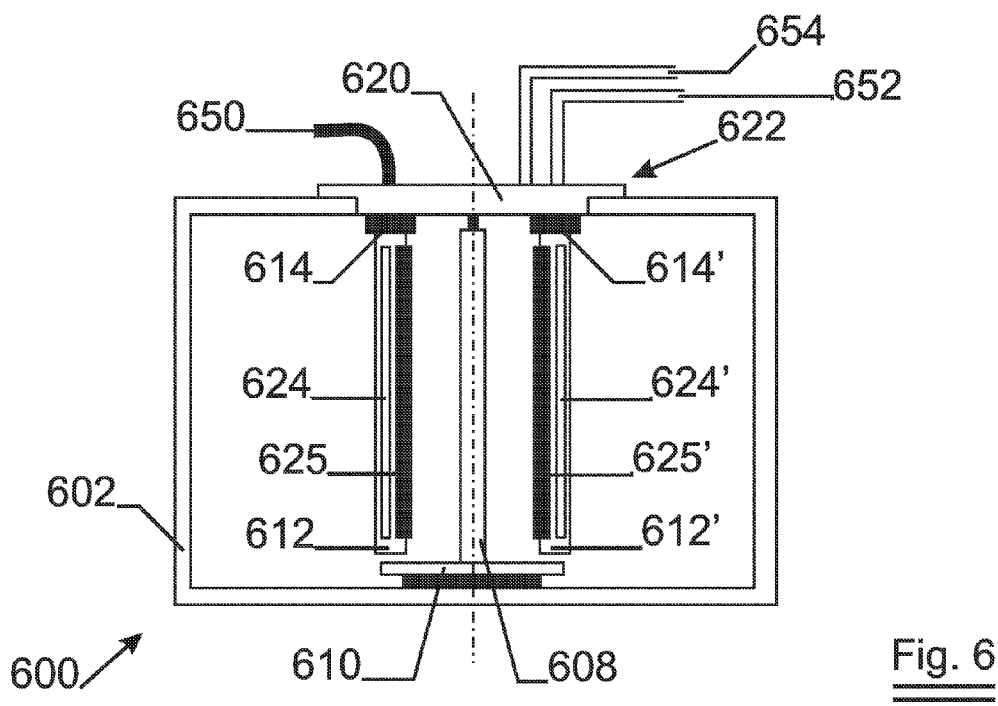
FIG. 6: shows a fifth preferred embodiment of the module for use in a vertical coater.

FIG. 6 shows a preferred embodiment 600 in which planar targets 612, 612' are vertically mounted and hanging from a module 622 into the chamber 602. The planar targets are removably connected to the interface flange 620 by means of connector blocks 614, 614'. The substrate 608 passes in between the targets 612, 612' and is carried by a transport system 610. The substrate can for example be a holder on which a series of substantially planar items—e.g. hard disk substrates—are mounted that are to be coated. Target material 625, 625' is sputtered towards the substrate and a racetrack shaped plasma is maintained by magnet systems 624, 624'. The module receives electricity and coolant through a current feed 650 and coolant supply and outlet hoses 652, 654.

Figure 7B:
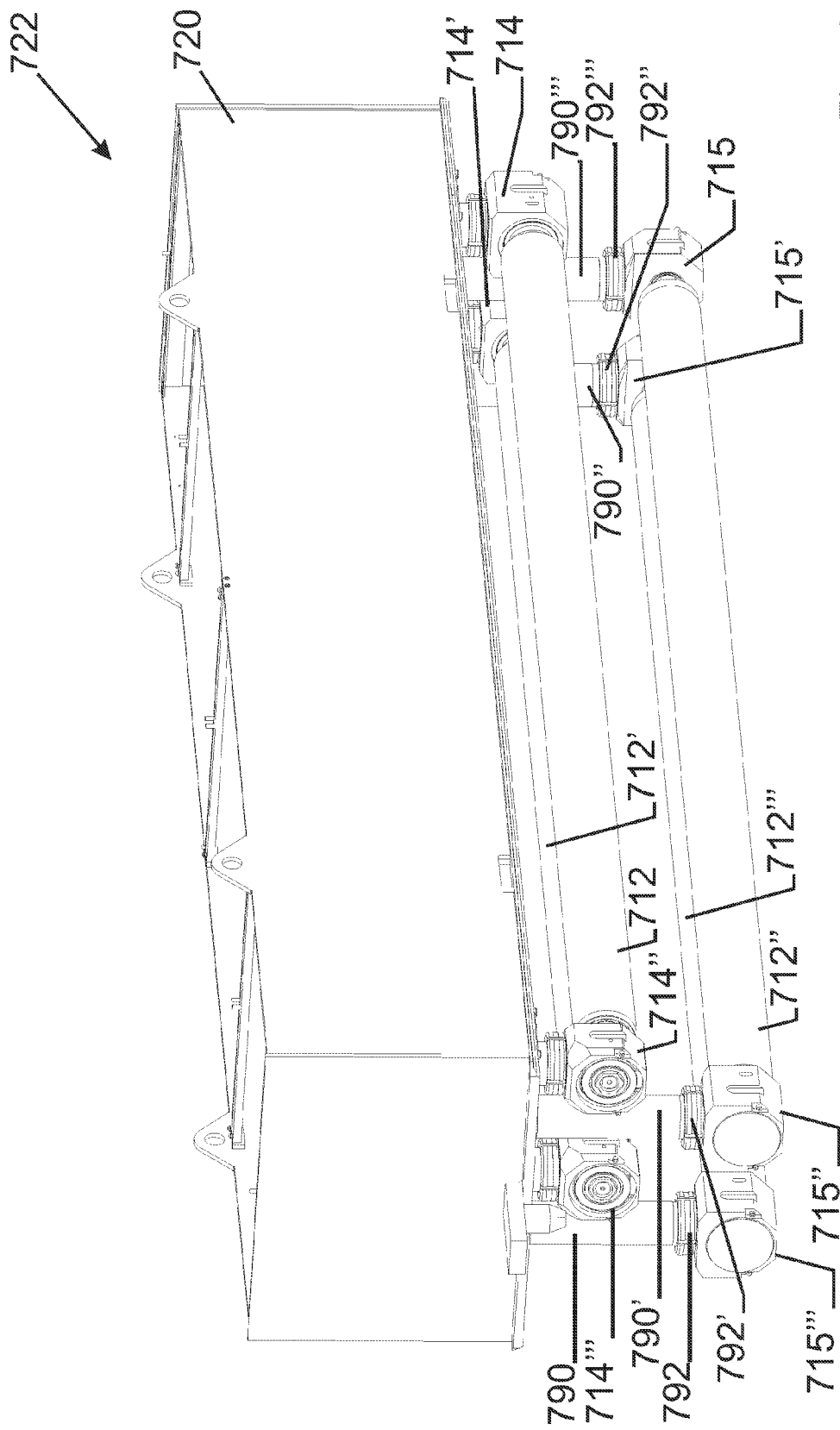
FIG. 7: 'a' and 'b' show a perspective view of different implementations of the invention having differently arranged sequences for the targets.

FIG. 7 'a' shows an implementation of the inventive principle wherein maximal use of standard connector blocks has been used. The eight connector blocks 714, 714', 714", 714'" and 715, 715', 715", 715'" are so arranged that they carry four targets 712, 712', 712", 712'" pairwise arranged side by side. The connector blocks are attached to one single interface flange 720. The pairs of targets (712, 712') and (712", 712'") are placed in cascade: two targets coating the topside followed by two targets coating the underside of the substrate (or vice versa). In order to be able to use standard end-blocks, extension pieces 790, 790', 790", 790'" are introduced whereon the end-blocks can be mounted with a single screw connector 792, 792', 792", 792'". FIG. 7 'b' shows another embodiment but with an alternating sequence of targets (topside, underside, topside, underside or vice versa). Here the extensions allows for a more compact arrangement along the movement direction of the substrate.

While the invention has been particularly described and shown with reference to certain preferred embodiments, it will be understood by those skilled in the art that various operations and modifications in form and detail may be made therein. Accordingly it is intended that the claims cover all such alterations and modifications as falling within the true scope and spirit of invention.

The invention claimed is:

1. A module for carrying sputtering targets, said module comprising:
an interface flange vacuum-tight mountable on a sputter deposition installation,
wherein said installation is configured to coat a substrate having two sides, said interface flange including at least two elongated rotatable targets, with said rotatable targets being mountable to said interface flange,
wherein each one of said rotatable targets comprises a magnet system configured to direct sputter deposition,
wherein, when said module is mounted with said interface flange to said installation, said targets take positions at opposite sides of said two-sided substrate with each one of said magnet systems oriented towards said substrate, and
wherein said module further includes at least one substrate support for supporting said substrate during coating so as to enable coating of both sides of said substrate in one operation.

2. The module according to claim 1, wherein axes of said targets are substantially perpendicular to said interface flange.

3. The module according to claim 2, wherein said module further comprises at least one connector block mounted to said flange for carrying said targets at one end.

4. The module according to claim 1, wherein axes of said targets are substantially parallel to said interface flange.

5. The module according to claim 4, wherein said module further comprises at least two connector blocks mounted to said flange for carrying said targets at both ends.

6. The module according to claim 5, wherein said module further comprises at least four connector blocks mounted to said flange for carrying said targets at both ends.

7. The module according to claim 1, that further comprises at least one gas distribution system that is mounted to said interface flange.

8. The module according to claim 1, wherein said module further carries an enclosure with an entrance and exit slit to let the substrate pass through, said slit having adjustable side blinds to isolate said targets from one another.

9. The module according to claim 8, wherein said side blinds are adjusted by a substrate width detector.

10. The module according to claim 8, wherein said side blinds are configured to substantially prevent gas on one side of the substrate mixing with gas on the opposite side of the substrate.

11. A method to upgrade a large area coater, comprising the steps of:
removing drop-in modules for single side sputtering; and
inserting the module according to claim 1.

12. A method for operating a large area coater including the module of claim 7, comprising the steps of:
stacking two substrates having two sides on top of each other,
coating outer sides of said stacked substrates in said large area coater including the module of claim 7, and
separating said two substrates.

* * * * *